United States Patent [19]

Kobatake

[11] Patent Number: 5,134,456
[45] Date of Patent: Jul. 28, 1992

[54] VOLTAGE DIVIDER FOR HIGH-SPEED HIGH-PRECISION SIGNAL CONVERTING UNIT

[75] Inventor: Hiroyuki Kobatake, Tokyo, Japan
[73] Assignee: NEC Corporation, Tokyo, Japan
[21] Appl. No.: 699,714
[22] Filed: May 14, 1991
[30] Foreign Application Priority Data
   May 17, 1990 [JP] Japan ............................. 2-128047
[51] Int. Cl.[5] ................................ H01L 27/02
[52] U.S. Cl. .................................. 357/41; 357/42; 357/51
[58] Field of Search ....................... 357/41, 42, 51

Primary Examiner—Mark V. Prenty
Attorney, Agent, or Firm—Burns, Doane, Swecker & Mathis

[57] ABSTRACT

A voltage divider comprises a string of resistive elements implemented by an elongated n-type impurity region formed in a lightly doped p-type semiconductor substrate, and n-channel type switching transistors with a short channel length formed in a heavily doped p-type well in the semiconductor substrate and associated with the resistive elements for coupling one of the associated resistive elements to an output node, wherein the ligthly doped semiconductor substrate decreases a parasitic capacitance coupled to the elongated n-type impurity region so that the string of the resistive elements is improved in propagation speed and a bias dependency.

15 Claims, 7 Drawing Sheets

VOLTAGE DIVIDER FOR HIGH-SPEED HIGH-PRECISION SIGNAL CONVERTING UNIT

FIELD OF THE INVENTION

This invention relates to a signal converting unit such as a digital-to-analog converting unit or an analog-to-digital converting unit and, more particularly, to a voltage divider incorporated in a high-speed high-precision signal converting unit.

DESCRIPTION OF THE RELATED ART

Figure 1:
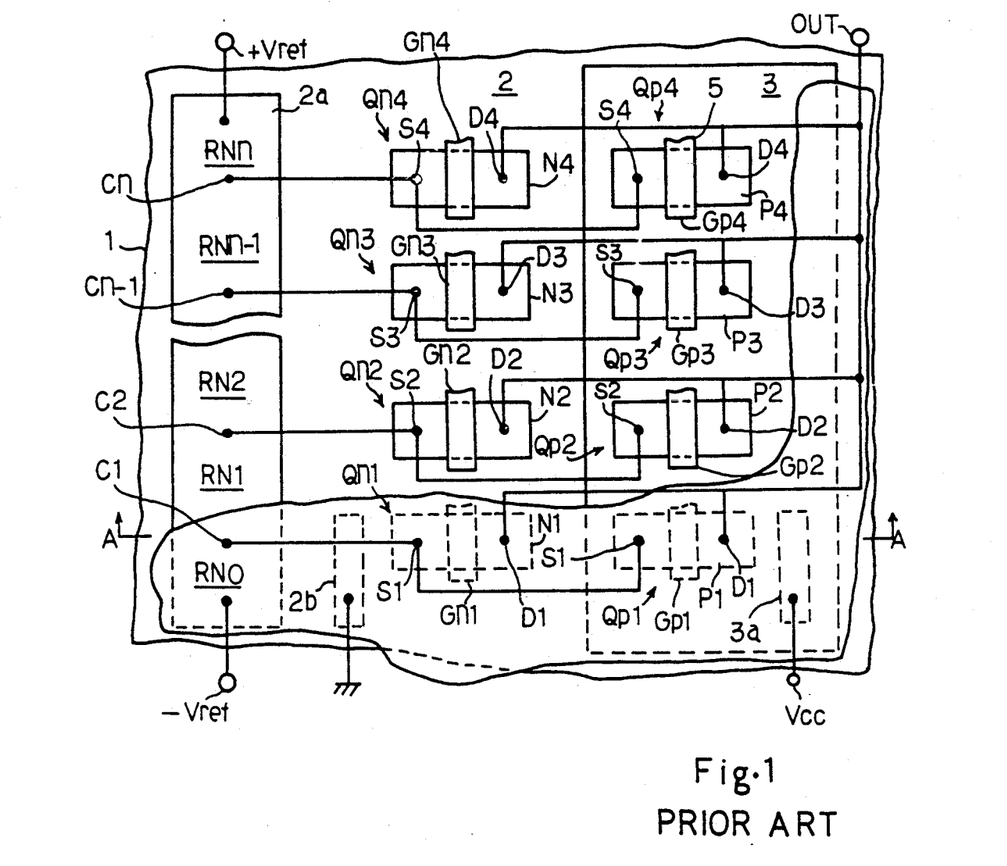
FIG. 1 is a plan view showing the layout of the prior art digital-to-analog converting unit.
Figure 2:
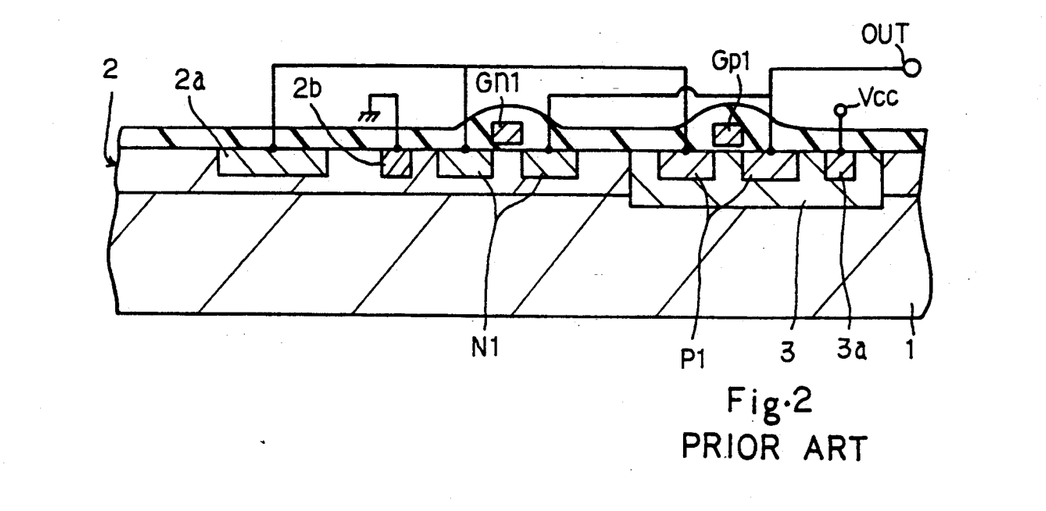
FIG. 2 is a cross sectional view taken along line A—A of FIG. 1 and showing the structure of the prior art digital-to-analog converting unit.

A typical example of the digital-to-analog converting unit is illustrated in FIGS. 1 and 2 and fabricated on a lightly doped p-type semiconductor substrate 1 with impurity concentration of $1.0 \times 10^{15}$ atoms/cm$^3$. In the surface portion of the lightly doped p-type semiconductor substrate 1 are formed a heavily doped p-type well 2 and an n-type well 3 which are contiguous to each other. The heavily doped p-type well 2 has the impurity concentration of about $1.0 \times 10^{16}$ atoms/cm$^3$, and the heavily-doped p-type well 2 allows n-channel type field effect transistors Qn1, Qn2, Qn3 and Qn4 to decrease the channel length thereof. Namely, in the heavily-doped p-type well 2, an elongated heavily-doped n-type impurity region 2a is formed and provides a string of resistive elements RN0, RN1, RN2, RNn-1 and RNn which are associated with voltage nodes C1, C2, Cn-1 and Cn. N-type impurity regions N1, N2, N3 and N4 are formed in the heavily-doped p-type well 2 at spacings, and the n-type impurity regions N1 to N4 respectively form the n-channel type field effect transistors Qn1 to Qn4 together with respective gate electrodes Gn1, Gn2, Gn3 and Gn4. The heavily-doped p-type well 2 is grounded through a p-type ohmic contact region 2b.

In the n-type well 3 are formed p-type impurity regions P1, P2, P3 and P4 at spacings which respectively form p-channel type field effect transistors Qp1, Qp2, Qp3 and Qp4 together with respective gate electrodes Qp1, Qp2, Qp3 and Qp4. The n-type well 3 is coupled through an n-type ohmic contact region 3a to a source of power voltage level Vcc.

The elongated n-type impurity region 2a is coupled between a positive reference voltage level +Vref and a negative reference voltage level −Vref, and the voltage nodes C1 to Cn are coupled in parallel to the source nodes S1, S2, S3 and S4 of the n-channel type and p-channel type field effect transistors Qn1 to Qn4 and Qp1 to Qp4. The drain nodes D1, D2, D3 and D4 of the n-channel type and p-channel type field effect transistors Qn1 to Qn4 and Qp1 to Qp4 are coupled to an output node OUT, and voltage level at the output node OUT depends on the selective switching action on the field effect transistors Qn1 to Qn4 and Qp1 to Qp4.

The prior art digital-to-analog converting unit thus arranged behaves as follows. If an input digital signal causes one of the n-channel type field effect transistors Qni and one of the p-channel type field effect transistors Qpi where i is either 1, 2, 3 or 4, a driver unit (not shown) supplies the power voltage level Vcc and the ground voltage level to the gate electrodes Gni and Gpi, respectively, and the n-channel type field effect transistor Qni and the p-channel type field effect transistor Qpi concurrently turn on to couple the associated voltage node of the elongated n-type impurity region 2a to the output node OUT. The voltage level Vout at the output node OUT is given by Equation 1.

$$V_{out} = \frac{\sum_{m=0}^{i-1}(RNm)}{\sum_{m=0}^{n}(RNm)} \times [(+Vref) - (-Vref)] + (-Vref) \quad \text{Eq. 1}$$

Figure 3:
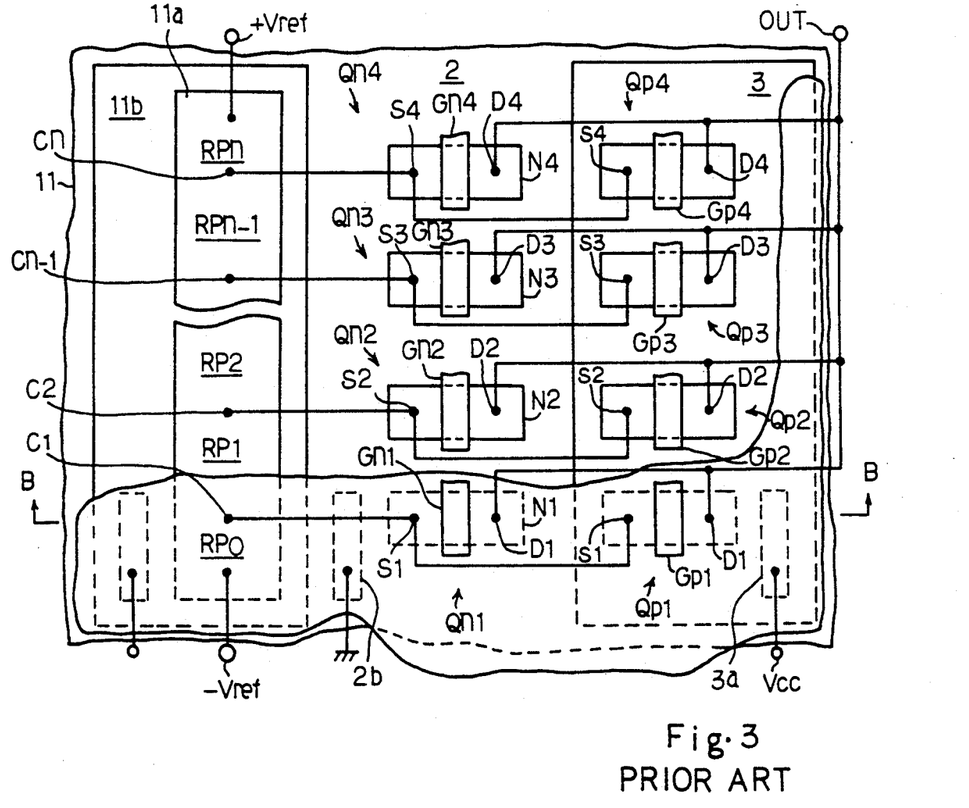
FIG. 3 is a plan view showing the layout of another digital-to-analog converting unit.
Figure 4:
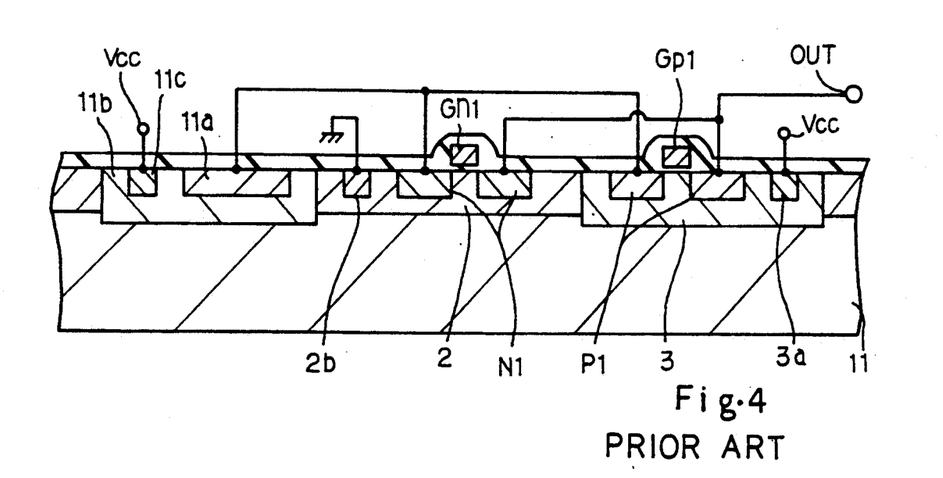
FIG. 4 is a cross sectional view taken along line B-B of FIG. 3 and showing the structure of the prior art digital-to-analog converting unit.

FIGS. 3 and 4 show another prior art digital-to-analog converting unit which is fabricated on a lightly doped p-type semiconductor substrate 11. In order to fabricate the digital-to-analog converting unit shown in FIGS. 3 and 4, the voltage divider implemented by the elongated n-type impurity region 2a is replaced with an elongated p-type impurity region 11a formed in an n-type well 11b for producing a string of resistive elements RP0, RP1, RP2, RPn-1 and RPn. However, other regions and component elements are similar to those of the digital-to-analog converting unit shown in FIGS. 1 and 2, and the same references are used for designating the corresponding regions and elements without description. The n-type well 11b is coupled through an n-type ohmic contact region 11c to the source of power voltage level Vcc.

The circuit behavior of the digital-to-analog converting unit shown in FIGS. 3 and 4 is similar to that of the digital-to-analog converting unit. However, the output voltage level Vout is given by Equation 2.

$$V_{out} = \frac{\sum_{m=0}^{i-1}(RPm)}{\sum_{m=0}^{n}(RPm)} \times [(+Vref) - (-Vref)] + (-Vref) \quad \text{Eq. 2}$$

A problem is encountered in the prior art digital-to-analog converting units in the converting speed and the precision. In detail, the well 2 is heavily doped with impurity atoms for decreasing the channel length of the field effect transistors Qn1 to Qn4 formed therein as described hereinbefore. However, an extremely thin depletion layer extends from the p-n junction between the heavily doped elongated impurity region 2a and the heavily doped well 2, and the extremely thin depletion layer causes a large amount of parasitic capacitance to couple with the elongated impurity region 2a or the string of the resistive elements RN0 to RNn. The large amount of parasitic capacitance retards propagation of the reference voltage and, accordingly, retrieval of voltage level upon change of the designated voltage node C1 to Cn. For this reason, the digital-to-analog converting unit hardly achieves a highspeed converting operation.

Moreover, the string of the resistive elements RN0 to RNn is coupled between the positive reference voltage level +Vref and the negative reference voltage level −Vref, and the ground voltage level is supplied to the p-type well 2. Then, a biasing voltage level of −(−Vref) is supplied through the parasitic capacitor to the resistive element RN0, and a biasing voltage level of −(+Vref) is supplied through the parasitic capacitor to the resistive element RNn. Thus, the different biasing voltage levels are supplied at both ends thereof to the resistive elements RN0 and RNn, respectively, and the large amount of the parasitic capacitance enhances a bias dependency of the resistive elements RN0 to RNn. Therefore, even though the , dimensions of each resistive element RN0 to RNn is precisely adjusted to predetermined values, dispersion takes place in the resistances produced by the respective resistive elements RN0 to RNn, and the dispersion deteriorates the precision of the digital-to-analog converting operation.

The problems may not be so serious to the prior art digital-to-analog converting unit shown in FIGS. 3 and 4, because the impurity concentration of the n-type well 11b is not linked to the channel length of the field effect transistors Qn1 to Qn4. However, it is necessary to carry out an additional lithographic stage followed by a doping stage for the n-type well 11b, and these additional stages increase the production cost of the digital-to-analog converting unit.

SUMMARY OF THE INVENTION

It is therefore an important object of the present invention to provide a voltage divider which achieves a high-speed and high-precision converting operation.

To accomplish these objects, the present invention proposes to decrease a parasitic capacitance coupled to an elongated impurity region formed for a string of resistive elements.

In accordance with one aspect of the present invention, there is provided a voltage divider fabricated on a lightly doped semiconductor substrate of a first conductivity type, comprising: (a) a heavily doped first well of the first conductivity type formed in a surface portion of the semiconductor substrate; (b) a plurality of first switching transistors formed in the heavily doped first well and coupled to an output node; (c) a lightly doped portion of the first conductivity type located in another surface portion of the semiconductor substrate; and (d) an elongated impurity region formed in the lightly doped portion and having a second conductivity type opposite to the first conductivity type, the elongated impurity region providing a plurality of resistive elements coupled between first and second sources of voltage level different from one another, the plurality of resistive elements being coupled to the plurality of first switching transistors for selectively coupling to the output node.

In accordance with another aspect of the present invention, there is provided a voltage divider fabricated on a lightly doped semiconductor substrate of a first conductivity type, comprising: (a) a heavily doped first well of the first conductivity type formed in a surface portion of the semiconductor substrate; (b) a plurality of first switching transistors formed in the heavily doped first well and coupled to an output node; (c) another surface portion defined in the semiconductor substrate and biased with either negative or positive voltage level; and (d) an elongated impurity region formed in the aforesaid another surface portion and providing a plurality of resistive elements coupled between first and second sources of voltage level different from one another, the plurality of resistive elements being coupled to the plurality of first switching transistors for selectively coupling to the output node.

BRIEF DESCRIPTION OF THE DRAWINGS

The features and advantages of the high-speed and high-precision voltage divider according to the present invention will be more clearly understood from the following description taken in conjunction with accompanying drawings in which.

DESCRIPTION OF THE PREFERRED EMBODIMENTS

First Embodiment

Figure 5:
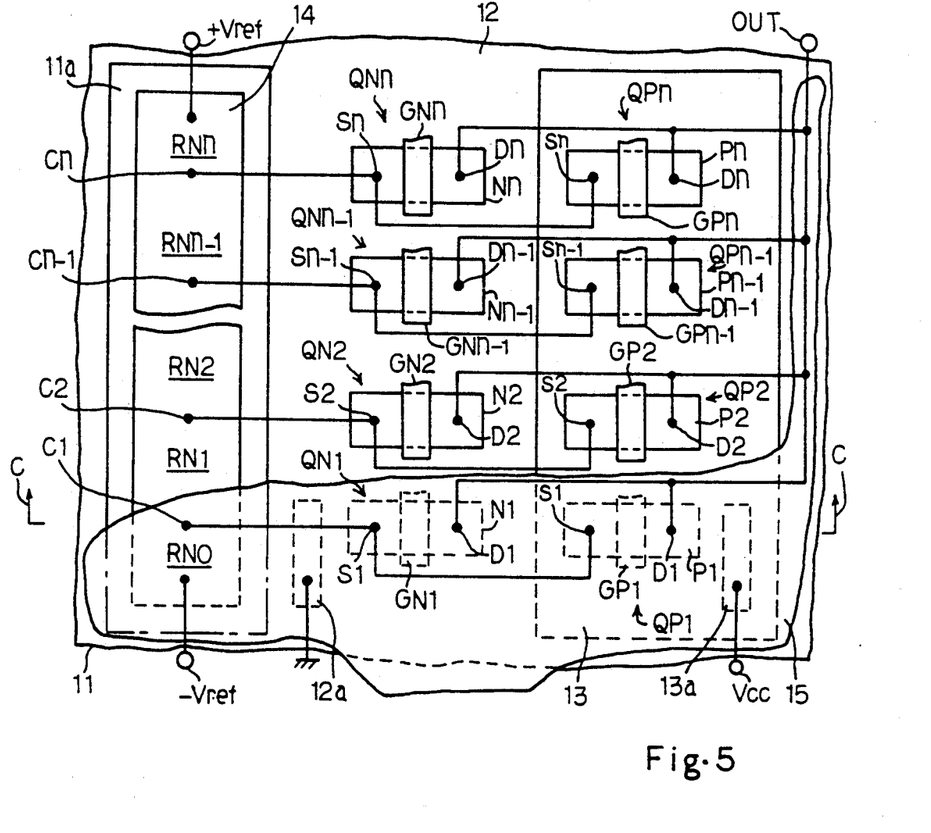
FIG. 5 is a plan view showing the layout of a first digital-to-analog converting unit according to the present invention.
Figure 6:
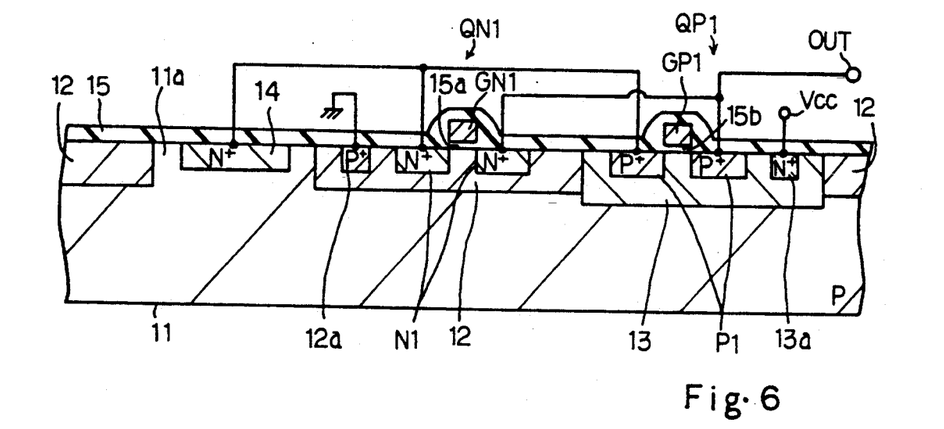
FIG. 6 is a cross sectional view taken along line C—C of FIG. 5 and showing the first digital-to-analog converting unit.

Referring to FIGS. 5 and 6, a digital-to-analog converting unit embodying the present invention is fabricated on a lightly doped semiconductor substrate 11, and the semiconductor substrate 11 is doped with p-type impurity atoms of about $1.0 \times 10^{15}$ atoms/cm$^3$. In the surface portion of the semiconductor substrate 11 is formed a heavily doped p-type well 12 the impurity concentration of which is as high as about $1.0 \times 10^{16}$ atoms/cm$^3$. Since the heavily-doped p-type well 12 does not cover the entire surface of the semiconductor substrate 11, a part 11a of the lightly-doped semiconductor substrate 11 is exposed, and an n-type well 13 is surrounded by the p-type well 12. An elongated heavily doped n-type impurity region 14 is formed in the part 11a of the semiconductor substrate 11, and provides a string of resistive elements RN0, RN1, RN2, RNn-1 and RNn. The resistive elements RN0 to RNn are associated with voltage nodes C1, C2, Cn-1 and Cn, and the string of the resistive elements Rn0 to RNn is coupled between a source of positive reference voltage +Vref and s source of negative reference voltage −Vref.

In the p-type well 12 a plurality of heavily doped n-type regions N1, N2, Nn-1 and Nn are formed at spacings, and the heavily doped n-type regions N1 to Nn provides source regions S1, S2, Sn-1 and Sn and drain regions D1, D2, Dn-1 and Dn. Thin gate insulating films 15a are grown over that areas between the source regions S1 to Sn and the drain regions D1 to Dn, and gate electrodes GN1, GN2, GNn-1 and GNn are formed on the gate insulating films 15a, respectively. The source regions S1 to Sn, the drain regions D1 to Dn, the thin gate insulating films 15a and the gate electrodes GN1 to GNn form in combination n-channel enhancement type field effect transistors QN1, QN2, QNn-1 and QNn. The heavily doped p-type well 12 is coupled through a heavily-doped p-type ohmic contact region 12a to a ground node.

Similarly, in the n-type well 13 a plurality of heavily doped p-type impurity regions P1, P2, Pn-1 and Pn are formed at spacings, and the heavily doped p-type impurity regions P1 to Pn serve as source regions S1 to Sn and drain regions D1 to Dn. Thin gate insulating films 15b are grown over that areas between the source regions S1 to Sn and the drain regions D1 to Dn, and gate electrodes GP1, GP2, GPn-1 and GPn are provided on the thin gate insulating films 15b, respectively. P-channel enhancement type field effect transistors QP1, QP2, QPn-1 and QPn are fabricated from the source regions S1 to Sn, the drain regions D1 to Dn, the thin gate insulating films 15b and the gate electrodes GP1 to GPn. A heavily-doped n-type ohmic contact region 13a is provided in the n-type well 13, and a source of power voltage level Vcc is supplied through the heavily-doped n-type ohmic contact region 13a to the n-type well 13.

The voltage nodes C1 to Cn are coupled in parallel to the source regions S1 to Sn of the n-channel type and p-channel type field effect transistors QN1 to QNn and QP1 to QPn, and an output node OUT is shared between the drain nodes D1 to Dn. A thick insulating film 15 covers the semiconductor substrate 11, the n-channel enhancement type field effect transistors QN1 to QNn and the p-channel enhancement type field effect transistors QP1 to QPn.

Description is briefly made on circuit behavior of the digital-to-analog converting unit. When a digital signal is supplied to the digital-to-analog converting unit, one of the n-channel enhancement type field effect transistor QNi and the associated p-channel enhancement type field effect transistor (where i is either 1, 2, n−1 or n) concurrently turn on, and one of the voltage nodes Ci is electrically coupled to the output node OUT. Since the resistive elements RN0 to RNn are adjusted to voltage levels corresponding to the digital value, the voltage node Ci supplies a voltage level corresponding to the value of the digital signal to the output node OUT. The voltage level Vout at the output node OUT is calculated by Equation 1.

The n-channel enhancement type field effect transistors QN1 to QNn are formed in the heavily-doped p-type impurity region 1, and, for this reason, the channel length of those n-channel enhancement type field effect transistors QN1 to QNn is short enough to achieve a high speed switching action. However, the elongated heavily doped n-type impurity region 14 is formed in the lightly doped semiconductor substrate 11, and a depletion layer widely extends from the p-n junction into the lightly-doped semiconductor substrate 11. This results in a small amount of parasitic capacitance, and the digital-to-analog converting unit according to the present invention achieves a high-speed converting operation. Since the part 11a of the semiconductor substrate 11 is defined at the lithographic stage for the heavily-doped p-type well 12, any additional lithographic and doping stages are not carried out, and, accordingly, the production cost is not increased. Moreover, the small amount of the parasitic capacitance decreases the bias dependency of the resistive elements RN0 to RNn, and the digital-to-analog converting unit is improved in precision.

For better understanding, let us calculate the parasitic capacitance Cj1 coupled to the elongated heavily doped n-type impurity region 14, the parasitic capacitance Cj2 coupled to the elongated heavily doped n-type impurity region 2a, the width X1 of the depletion layer extending from the p-n junction into the n-type impurity region 14, and the width X2 of the depletion layer extending from the p-n junction into the n-type impurity region 2a. A parasitic capacitance Cjn and the width Xn of a depletion layer are respectively given by Equation 3 and Equation 4.

$$Cjn = \sqrt{\frac{q \cdot Xsi \cdot Epsilon0}{2} \frac{Na \cdot Nd}{Na + Nd} \frac{1}{Phi - Vb}} \quad \text{Eq. 3}$$

$$Xn = \sqrt{\frac{Na}{Na + Nd} \frac{2 \cdot Xsi \cdot Epsilon0}{q} \left(\frac{1}{Na} + \frac{1}{Nd}\right)(Phi - Vb)} \quad \text{Eq. 4}$$

where q is the magnitude of electronic charge of $1.6 \times 10^{-19}$ C, Epsilon0 is the permittivity in vacuum of $8.86 \times 10^{-14}$ F/cm, Xsi is 11.7 in this instance, Na is the acceptor density, Nd is the donor density, and Vb is a biasing voltage. Phi is given by Equation 5.

$$Phi = (RT/q) \ln [Na \, Nd/ni^2] \quad \text{Eq. 5}$$

where Rt/g is 26 millivolt at room temperature, and ni is the intrinsic density of $1.5 \times 10^{10}$ cm$^{-3}$. If the elongated heavily doped n-type impurity regions 2a and 14 are represented by Xjn, an effective depth of the n-type impurity regions 2a and 14 is the difference between Xjn and Xn. The resistance Rjn of the n-type impurity regions 2a and 14 is inversely proportional to (Xjn−Xn), and is given by Equation 6.

$$RJn = Rn/(Xjn - Xn) \quad \text{Eq. 6}$$

where Rn is constant.

The following assumptions are introduced in Equations 3, 4 and 5:

$Nd = 1.0 \times 10^{19}$ cm$^{-3}$ $Xjn = 0.2$ micron $-Vref = 0$ volt $+Vref = 5$ volts Table 1 shows the parasitic capacitances Cj1 and Cj2 as well as the resistance Rjn0 of the resistive element coupled to the source of negative reference voltage -Vref, and the resistance Rjnn of the resistive element coupled to the source of positive reference voltage +Vref. Since the negative and positive reference voltage levels are zero volt and 5 volts, Rjn0 and Rjnn are calculated on the assumption that Vb is zero and Vb is −5volts. Moreover, error Erjn between Rjn0 and Rjnn is defined by Equation 7 and also indicated in Table 1.

$$Erjn = \frac{Rjnn - Rjn0}{Rjn0} \times 100 \qquad \text{Eq. 7}$$

TABLE 1

|  | N-TYPE REGION 14 | N-TYPE REGION 2a |
|---|---|---|
| Cjn (F/cm²) | $1.01 \times 10^{-8}$ | $3.07 \times 10^{-8}$ |
| Rjn0 (ohm) | Rn × (5.003 × 10⁴) | Rn × (5.008 × 10⁴) |
| Rjnn (ohm) | Rn × (5.003 × 10⁴) | Rn × (5.022 × 10⁴) |
| Erjn (%) | 0.08 | 0.28 |

As will be understood from Table 1, the parasitic capacitance Cj1 coupled to the elongated heavily-doped n-type impurity region 14 is ⅓ of the parasitic capacitance and the error Rrjn is decreased to 1/3.5. This means that the digital-to-analog converting unit shown in FIGS. 5 and 6 are three times faster than the prior art digital-to-analog converting unit shown in FIGS. 1 and 2 and that the precision is improved three and half times rather than the prior art digital-to-analog converting unit. In short, the surface portion 11a of the lightly doped semiconductor substrate 11 decreases the parasitic capacitance for improving the operation speed and the precision.

Second Embodiment

Figure 7:
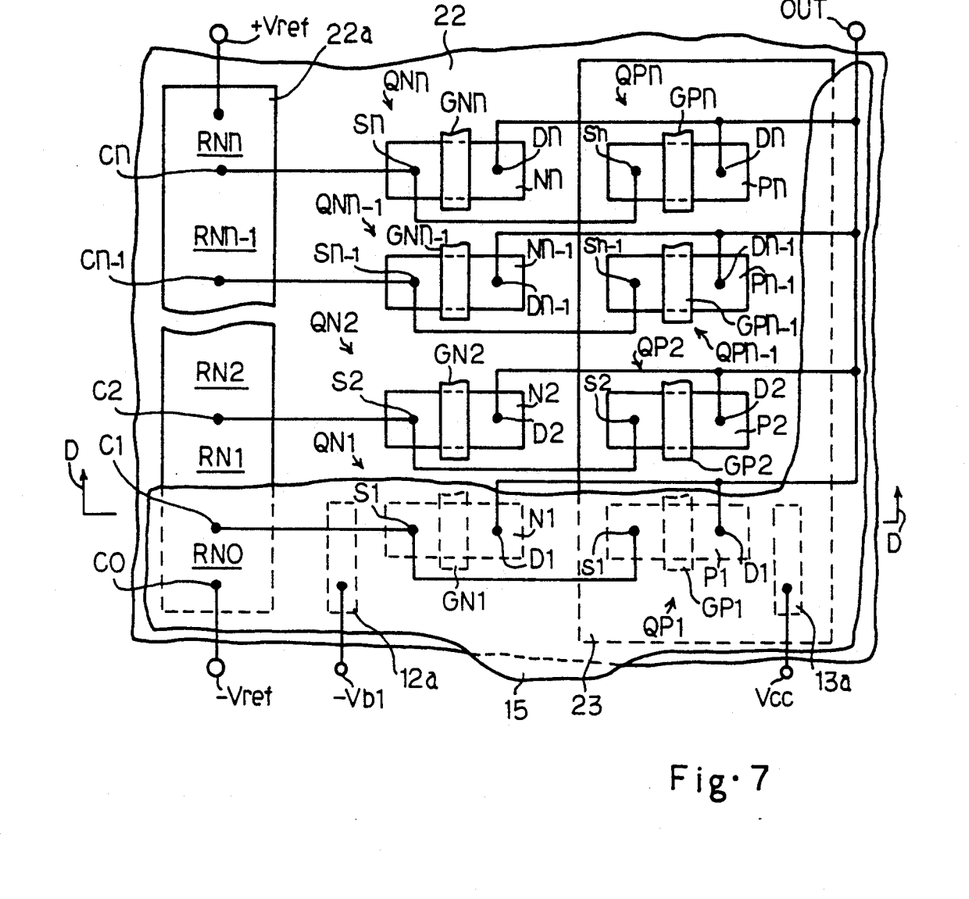
FIG. 7 is a plan view showing the layout of a second digital-to-analog converting unit according to the present invention.
Figure 8:
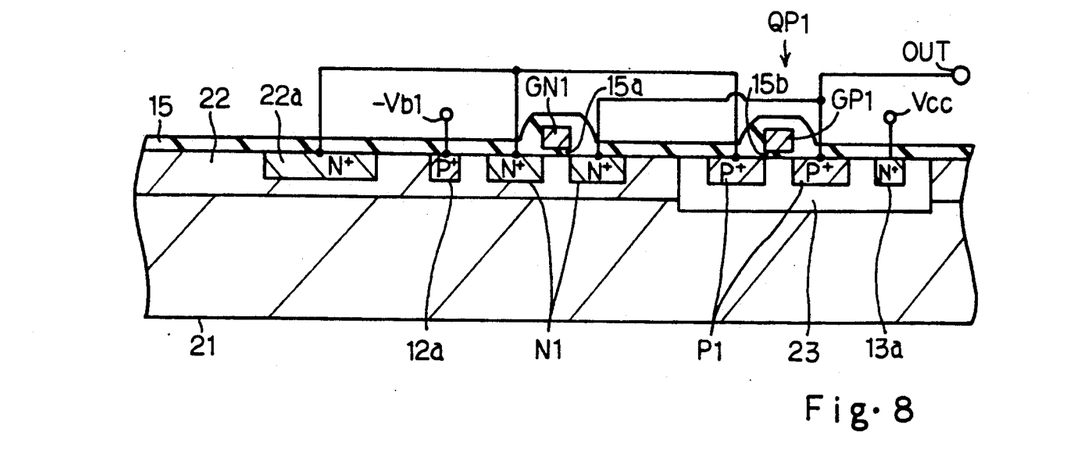
FIG. 8 is a cross sectional view taken along line D—D of FIG. 7 and showing the second digital-to-analog converting unit.

Turning to FIG. 7 and 8, another digital-to-analog converting unit embodying the present invention is fabricated on a lightly doped p-type semiconductor substrate 21. In the surface portion of the semiconductor substrate 21 are formed a heavily-doped p-type well 22 and an n-type well 23 which are contiguous to one another. The heavily-doped p-type well 22 has impurity concentration of about $1.0 \times 10^{16}$ atoms/ cm³, and an elongated heavily-doped n-type impurity region 22a and a plurality of n-channel enhancement type field effect transistors QN1 to QNn are formed in the heavily-doped p-type well 22 at spacings. However, the layout of the elongated heavily-doped n-type impurity region 22a, the structure of the n-channel enhancement type field effect transistors Qn1 to QNn, the layout of the n-type well 23 and the structure of p-channel enhancement type field effect transistors QP1 to QPn are similar to those of the first embodiment, and the corresponding parts and regions are designated by the same references without detailed description. The n-type well 23 is coupled through the heavily doped n-type ohmic contact region 13a to a source of power voltage level Vcc of, for example, +5 volts.

The heavily doped p-type well 22 is negatively biased with a substrate biasing voltage −Vb1, and the substrate biasing voltage −Vb1 is about −5 volts in this instance Since the heavily doped p-type well 22 and, accordingly, the lightly doped p-type substrate 21 are negatively biased, parasitic capacitance Cjn coupled to the elongated n-type impurity region 22a is decreased, and, therefore, the operation speed and the precision are improved.

The parasitic capacitance Cjn, the resistances Rjn0 and Rjn1 and the error Erjn are calculated for the second embodiment on the assumption that the reference voltages levels +Vref and −Vref are +5 volts and zero volt, and the calculation results are shown in Table 2. The resistance Rjn0 is calculated on Vb= −5 volts, and the resistance Rjn1 is on Vb= −10 volts.

TABLE 2

|  | N-TYPE REGION 22a | N-TYPE REGION 2a |
|---|---|---|
| Cjn (F/cm²) | $1.19 \times 10^{-8}$ | $3.07 \times 10^{-8}$ |
| Rjn0 (ohm) | Rn × (5.022 × 10⁴) | Rn × (5.008 × 10⁴) |
| Rjnn (ohm) | Rn × (5.030 × 10⁴) | Rn × (5.022 × 10⁴) |
| Erjn (%) | 0.16 | 0.28 |

As will be understood from Table 2, the negative substrate biasing voltage −Vb1 is effective against the parasitic capacitance. In fact, the parasitic capacitance is decreased to 1.2.6, and the error is 1/1.8 of that of the prior art converting unit. In other words, the digital-to-analog converting unit shown in FIGS. 7 and 8 achieves a high speed operation 2.6 times as high as that of the prior art converting unit shown in FIGS. 1 and 2, and the precision is 1.8 times as high as that of the prior art converting unit.

Third Embodiment

Figure 9:
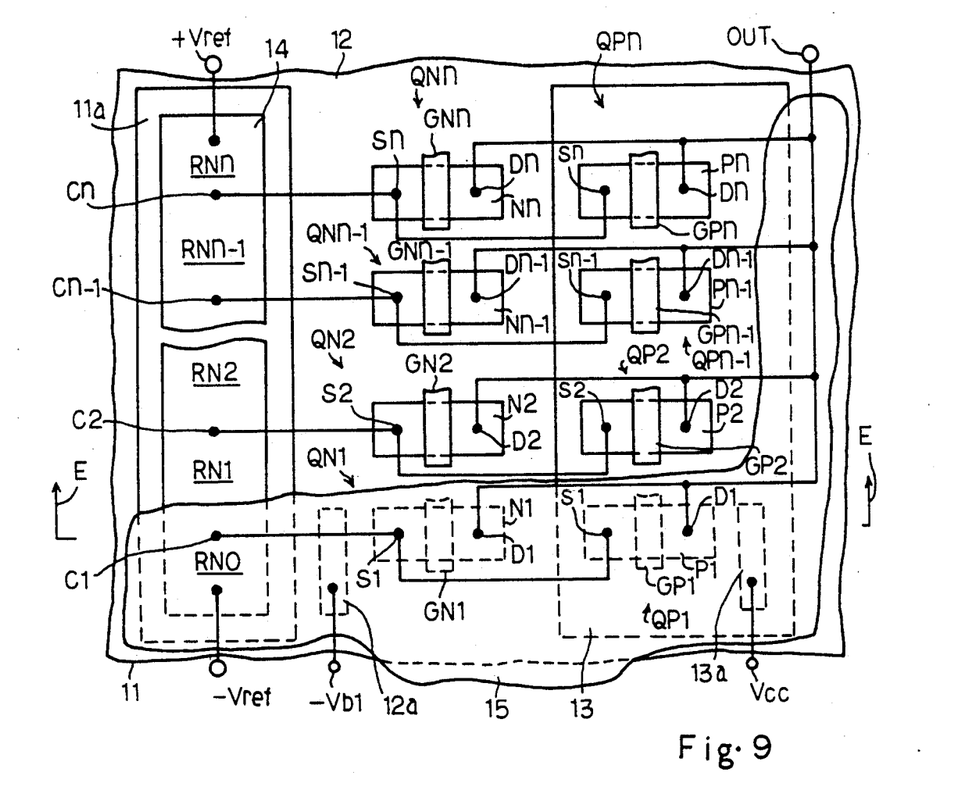
FIG. 9 is a plan view showing the layout of a third digital-to-analog converting unit according to the present invention.
Figure 10:
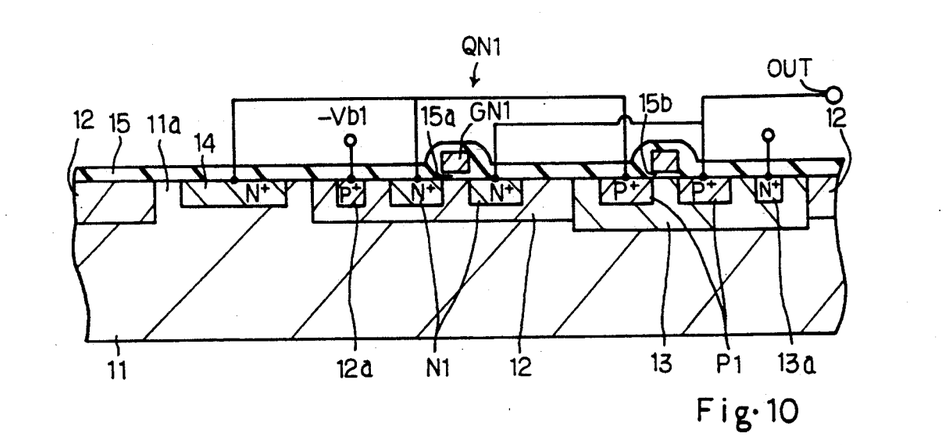
FIG. 10 is a cross sectional view taken along line E—E of FIG. 9 and showing the third digital-to-analog converting unit.

Turning to FIGS. 9 and 10 of the drawings, still another digital-to-analog converting unit embodying the present invention is illustrated. The layout and the structure are similar to those of the first embodiment with the exception that a substrate biasing voltage −Vb1 is applied to a heavily doped p-type well, and, for this reason, the same references designate regions, wells and component elements corresponding to those of the first embodiment without detailed description.

By virtue of the surface portion of the semiconductor substrate 11 as well as the negative substrate biasing voltage −Vb, parasitic capacitance Cjn coupled to the elongated heavily doped n-type region 14 and the bias dependency of the resistive elements RN0 to RNn become small, and a high-speed and high-precision operation is achieved. The parasitic capacitance Cj4, the resistances Rjn0 and Rjn1 and the error Rrjn are calculated for the third embodiment on the assumptions:

$-Vb = -5$ volts $-Vref =$ zero volt $+Vref = 5$ volts $Nd = 1.0 \times 10^{19}$ cm$^{-3}$ $Na = Nsub = 1.0 \times 10^{15}$ cm$^{-3}$ $Xjn = 0.2$ micron Table 3 shows the calculation results.

TABLE 3

|  | N-TYPE REGION 14 | N-TYPE REGION 2a |
|---|---|---|
| Cjn (F/cm²) | $3.78 \times 10^{-9}$ | $3.07 \times 10^{-8}$ |
| Rjn0 (ohm) | Rn × (5.007 × 10⁴) | Rn × (5.008 × 10⁴) |
| Rjnn (ohm) | Rn × (5.009 × 10⁴) | Rn × (5.022 × 10⁴) |
| Erjn (%) | 0.04 | 0.28 |

As will be understood from Table 3, the lightly-doped surface portion 11a and the negative substrate biasing voltage −Vb1 are effective against the parasitic capacitance and the error Erjn. In fact, the parasitic capacitance is decreased to 1/8.1, and the error is 1/7 of that of the prior art converting unit. In other words, the digital-to-analog converting unit shown in FIGS. 9 and 10 achieves a high speed operation 8.1 times as high as that of the prior art converting unit shown in FIGS. 1 and 2, and the precision is 7 times as high as that of the prior art converting unit.

Fourth Embodiment

Figure 11:
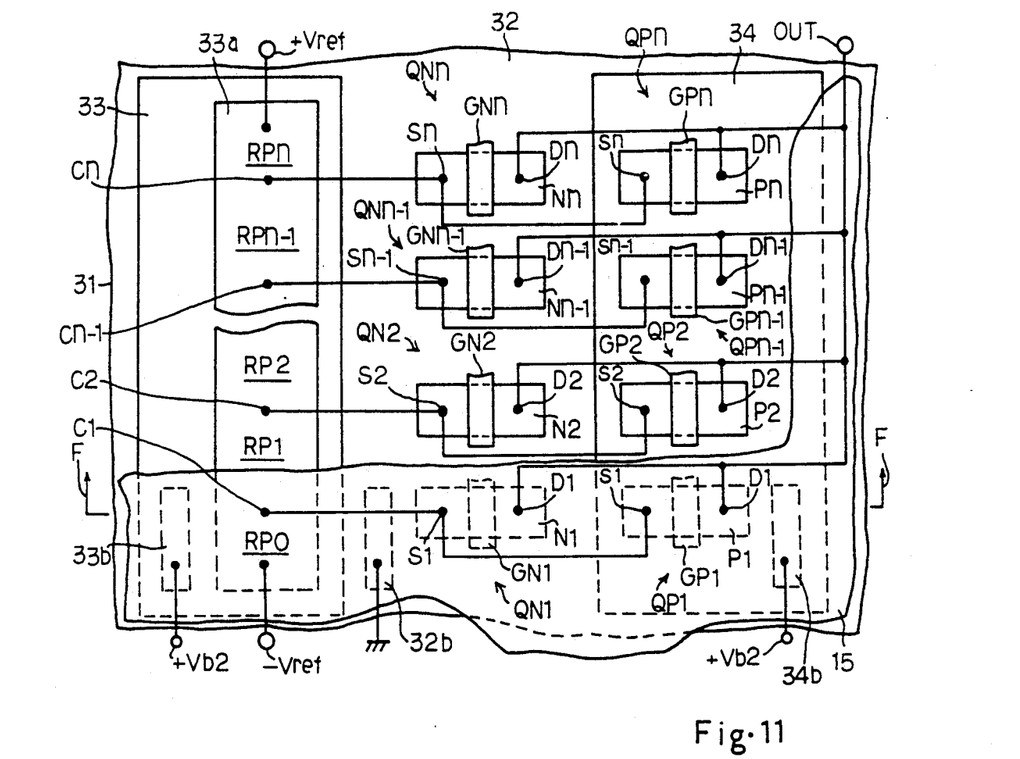
FIG. 11 is a plan view showing the layout of a fourth digital-to-analog converting unit according to the present invention.
Figure 12:
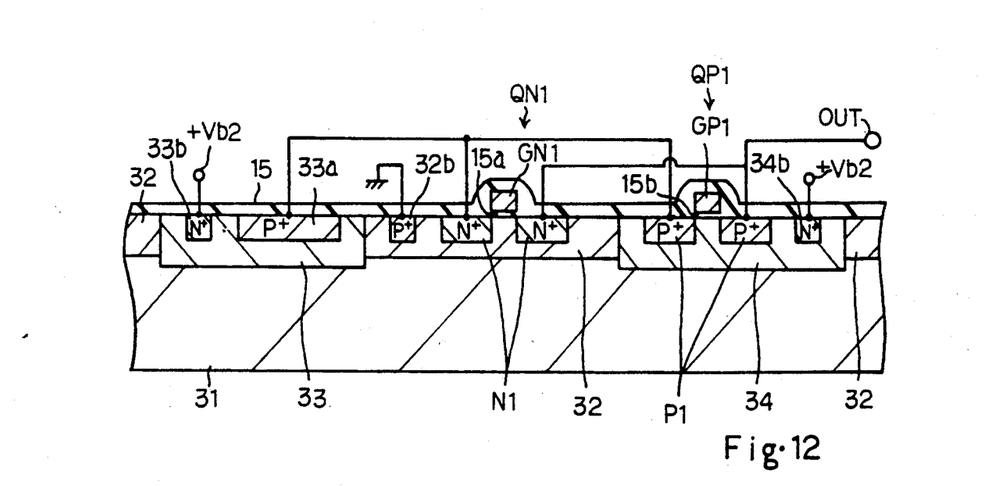
FIG. 12 is a cross sectional view taken along line F—F of FIG. 11 and showing the fourth digital-to-analog converting unit.

Turning to FIGS. 11 and 12, still another digital-to-analog converting unit embodying the present invention is fabricated on a lightly doped p-type semiconductor substrate 31. In the lightly doped p-type semiconductor substrate 31 are formed a heavily doped p-type well 32 in which two n-type wells 33 and 34 are formed and separated from each other. In the n-type well 33 an elongated heavily doped p-type impurity region 33a is formed and provides a string of resistive elements RP0, RP1, RP2, RPn-1 and RPn coupled between a positive reference voltage +Vref and a negative reference voltage −Vref. A plurality of n-channel enhancement type field effect transistors QN1 to QNn are formed in the p-type well 32, and a plurality of p-channel enhancement type field effect transistors QP1 to QPn. These enhancement type field effect transistors QN1 to QNn and QP1 to QPn are similar in structure to those of the first embodiment, and the same references designate regions, films and nodes corresponding to those of the first embodiment.

The p-type well 32 is coupled through a heavily doped p-type ohmic contact region 32b to a ground node, and the n-type wells 33 and 34 are biased through respective heavily doped n-type ohmic contact regions 33b and 34b with a positive biasing voltage level +Vb2 of about 10 volts.

The circuit behavior of the fourth embodiment is similar to the first embodiment, and description is omitted for the sake of simplicity. The positive biasing voltage level +Vb2 improves parasitic capacitance Cjn coupled to the elongated heavily doped p-type impurity region 33a and the bias dependency of the resistive elements RP0 to RPn. Let us estimate the parasitic capacitance Cjp and the error Erjp on the assumption that the n-type wells 33, 34, 11b and 3 have impurity concentration of $1.0 \times 10^{16}$ cm$^{-3}$. The n-type wells 33 and 34 are positively biased with +Vb2 of about 10 volts, and the n-type wells 11b and 3 (see FIGS. 3 and 4) are coupled to the source of power voltage level of about 5 volts. The parasitic capacitances Cjp and the width Xp of the depletion layers are calculated by Equations 8 and 9.

$$Cjp = \sqrt{\frac{q \cdot Xsi \cdot \text{Epsilon0}}{2} \cdot \frac{Na \cdot Nd}{Na + Nd} \cdot \frac{1}{\text{Phi} + Vb}} \qquad \text{Eq. 8}$$

$$Xp = \sqrt{\frac{Na}{Na + Nd} \cdot \frac{2 \, Xsi \, \text{Epsilon0}}{q} \left(\frac{1}{Na} + \frac{1}{Nd}\right)(\text{Phi} + Vb)} \qquad \text{Eq. 9}$$

where Nd is the impurity concentration of the n-type wells. The elongated heavily doped p-type impurity regions 33a and 11a are assumed to have a dept Xjp, and an effective depth thereof is given as (Xjp − Xp), and the resistance of the p-type impurity regions 33a and 11a are inversely proportional to (Xjp − Xp) and represented as Rp/(Xjp − Xp) where Rp is a constant. The following assumptions are introduced in Equations 8, 9 and 10:

$Na = 5.0 \times 10^{18}$ cm$^{-3}$ $Xjp = 0.25$ micron $-Vref = 0$ volt $+Vref = 5$ volts Table 4 shows the parasitic capacitances Cjp coupled to the p-type impurity regions 33a and 11a as well as the resistance Rjp0 of the resistive elements coupled to the source of negative reference voltage −Vref, and the resistance Rjpn of the resistive elements coupled to the source of positive reference voltage +Vref. Since the negative and positive reference voltage levels are zero volt and 5 volts, Rjp0 of the fourth embodiment are calculated on the assumption that Vb is 10 volts, and Rjpn and Cjp of the fourth embodiment Vb is calculated on Vb=5 volts. On the other hand, Rjp0 for the prior art is calculated from Vb=5 volts, and Rjpn and Cjp are calculated from Vb=0. Moreover, error Erjp between Rjp0 and Rjpn is defined by Equation 10 and also indicated in Table 4.

$$Erjp = \frac{Rjpn - Rjp0}{Rjp0} \times 100 \qquad \text{Eq. 10}$$

TABLE 4

|  | N-TYPE REGION 14 | N-TYPE REGION 2a |
|---|---|---|
| Cjp (F/cm$^2$) | $1.19 \times 10^{-8}$ | $3.10 \times 10^{-8}$ |
| Rjp0 (ohm) | Rp × (4.04 × 10$^4$) | Rp × (4.03 × 10$^4$) |
| Rjpn (ohm) | Rp × (4.03 × 10$^4$) | Rn × (4.01 × 10$^4$) |
| Erjp (%) | 0.25 | 0.50 |

As will be understood from Table 4, the positive biasing voltage +Vb2 is effective against the parasitic capacitance Cjp and the error Erjp. In fact, the parasitic capacitance is decreased to 1/2.6, and the error is ½ of that of the prior art converting unit. In other words, the digital-to-analog converting unit shown in FIGS. 11 and 12 achieves a high speed operation 2.6 times as high as that of the prior art converting unit shown in FIGS. 3 and 4, and the precision is 2 times as high as that of the prior art converting unit.

Fifth Embodiment

Figure 13:
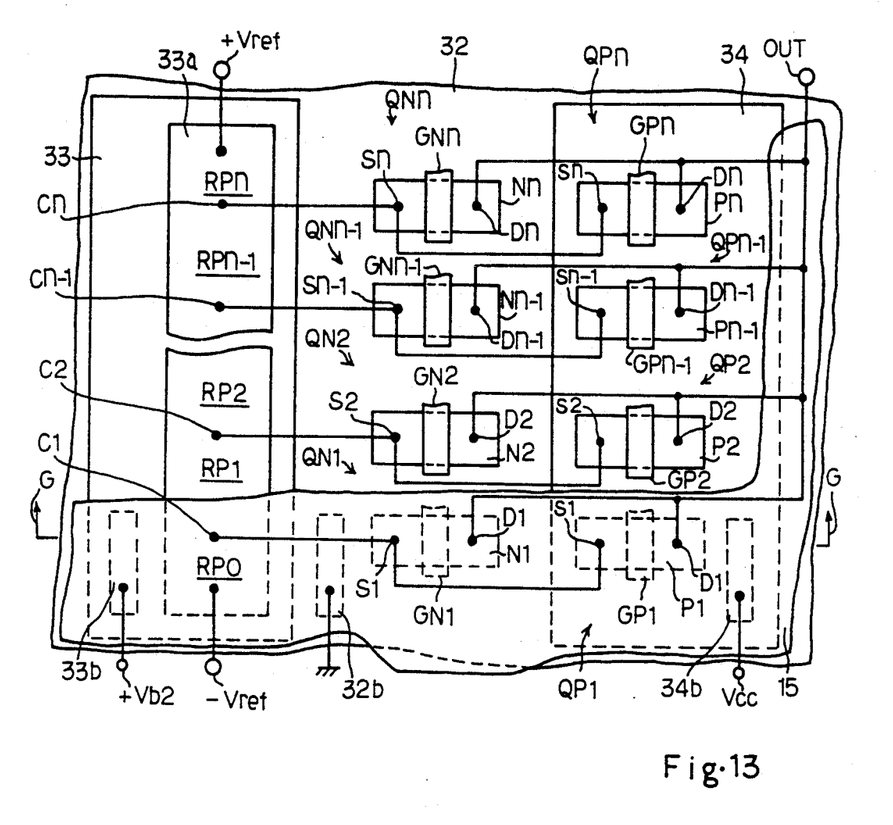
FIG. 13 is a plan view showing the layout of a fifth digital-to-analog converting unit according to the present invention.
Figure 14:
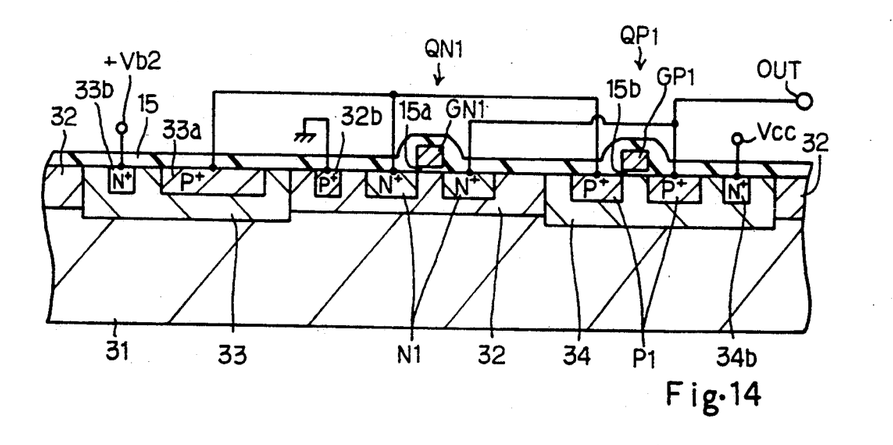
FIG. 14 is a cross sectional view taken along line G—G of FIG. 13 and showing the fifth digital-to-analog converting unit.

Turning to FIGS. 13 and 14, still another digital-to-analog converting unit embodying the present invention is illustrated. The fifth embodiment is similar in layout and structure to the fourth embodiment except for the n-type well 34 biased with the power voltage level Vcc of about 5 volts. For this reason, no further description is incorporated hereinbelow for avoiding repetition.

The power voltage level Vcc applied to the n-type well 34 prevents the p-channel enhancement type field effect transistors Qp1 to QPn from undesirable increased of threshold level due to the substrate biasing effect. For this reason, the switching action is faster than that of the fourth embodiment, and the on-resistance of each switching transistor is lowered. This results in a faster converting operation than the digital-to-analog converting unit with the n-type wells 33 and 34 both applied with the positive biasing voltage level +Vb2.

As will be understood from the foregoing description, the operation speed and the precision of the voltage divider according to the present invention are surely improved by virtue of the lightly doped surface portion and/or either positive or negative biasing voltage.

Although particular embodiments of the present invention have been shown and described, it will be obvious to those skilled in the art that various changes and modifications may be made without departing from the spirit and scope of the present invention. For example, a substrate may be doped with n-type impurity atoms, and wells and regions are opposite in conductivity type to those of each embodiment. Moreover, each voltage divider according to the present invention may form a part of anther signal converting unit such as, for example, an analog-to-digital converting unit.

What is claimed is:

1. A voltage divider fabricated on a lightly doped semiconductor substrate of a first conductivity type, comprising:
   (a) a heavily doped first well of said first conductivity type formed in a surface portion of said semiconductor substrate;
   (b) a plurality of first switching transistors formed in said heavily doped first well and coupled to an output node;
   (c) a lightly doped portion of said first conductivity type located in another surface portion of said semiconductor substrate; and
   (d) an elongated impurity region formed in said lightly doped portion and having a second conductivity type opposite to said first conductivity type, said elongated impurity region providing a plurality of resistive elements coupled between first and second sources of voltage level different from one another, said plurality of resistive elements being respectively coupled to said plurality of first switching transistors for selectively coupling to said output node.

2. A voltage divider as set forth in claim 1, in which said lightly doped portion forms a part of said semiconductor substrate.

3. A voltage divider as set forth in claim 2, in which said voltage divider further comprises a second well of said second conductivity type formed in still another surface portion of said semiconductor substrate and positively biased, and a plurality of second switching transistors coupled in parallel to said plurality of first switching transistors between said plurality of resistive elements and said output node.

4. A voltage divider as set forth in claim 2, in which said heavily doped first well is approximately equal in bias voltage to said lightly doped portion.

5. A voltage divider as set forth in claim 4, in which said first conductivity type is produced by doping p-type impurity atoms, and in which said heavily-doped first well is negatively biased.

6. A voltage divider as set forth in claim 5, in which said voltage divider further comprises a second well of said second conductivity type formed in still another surface portion of said semiconductor substrate and positively biased, and a plurality of second switching transistors coupled in parallel to said plurality of first switching transistors between said plurality of resistive elements and said output node.

7. A voltage divider fabricated on a lightly doped semiconductor substrate of a first conductivity type, comprising:
   (a) a heavily doped first well of said first conductivity type formed in a surface portion of said semiconductor substrate;
   (b) a plurality of first switching transistors formed in said heavily doped first well and coupled to an output node;
   (c) another surface portion defined in said semiconductor substrate and biased with either negative or positive voltage level; and
   (d) an elongated impurity region formed in said another surface portion and providing a plurality of resistive elements coupled between first and second sources of voltage level different from one another, said plurality of resistive elements being coupled to said plurality of first switching transistors for selectively coupling to said output node, in which said elongated impurity region has a second conductivity type, and in which said another surface portion forms a part of said heavily-doped first well.

8. A voltage divider as set forth in claim 7, in which said first conductivity type is produced by doping p-type impurity atoms, and in which said another surface portion is negatively biased.

9. A voltage divider as set forth in claim 8, in which said voltage divider further comprises a second well of said second conductivity type formed in still another surface portion of said semiconductor substrate and positively biased, and a plurality of second switching transistors coupled in parallel to said plurality of first switching transistors between said plurality of resistive elements and said output node.

10. A voltage divider fabricated on a lightly doped semiconductor substrate of a first conductivity type, comprising:
    (a) a heavily doped first well of said first conductivity type formed in a surface portion of said semiconductor substrate;
    (b) a plurality of first switching transistors formed in said heavily doped first well and coupled to an output node;
    (c) another surface portion defined in said semiconductor substrate and biased with either negative or positive voltage level; and
    (d) an elongated impurity region formed in said another surface portion and providing a plurality of resistive elements coupled between first and second sources of voltage level different from one another, said plurality of resistive elements being coupled to said plurality of first switching transistors for selectively coupling to said output node, in which said another surface portion is implemented by a second well of a second conductivity type opposite to said first conductivity type, and in which the magnitude of a bias voltage level at said second well is larger than the magnitude of a power voltage level of said voltage divider.

11. A voltage divider as set forth in claim 10, in which said first conductivity type is produced by doping p-type impurity atoms, and in which said second well is positively biased.

12. A voltage divider as set forth in claim 11, in which said heavily-doped first well is grounded.

13. A voltage divider as set forth in claim 12, in which said voltage divider further comprises a third well of said second conductivity type, and a plurality of second switching transistors coupled in parallel to said plurality of first switching transistors between said plurality of resistive elements and said output node.

14. A voltage divider as set forth in claim 13, in which said third well si positively biased.

15. A voltage divider as set forth in claim 13, in which said third well is biased with a positive voltage level different from said second well.

* * * * *